United States Patent [19]

Berger et al.

[11] Patent Number: 4,740,908
[45] Date of Patent: Apr. 26, 1988

[54] ANALOG ACCUMULATOR

[75] Inventors: Jean Luc Berger, Grenoble; Louis Brissot; Bruno Virando, both of St. Egreve, all of France

[73] Assignee: Thomson-CSF, Paris, France

[21] Appl. No.: 705,569

[22] Filed: Feb. 26, 1985

[30] Foreign Application Priority Data

Mar. 6, 1984 [FR] France ............................... 84 03435

[51] Int. Cl.⁴ .............................................. G06G 7/18
[52] U.S. Cl. ..................... 364/829; 364/807
[58] Field of Search ............... 364/600, 602, 605, 800, 364/807, 825, 829–835, 861–862; 333/165–166

[56] References Cited

U.S. PATENT DOCUMENTS

| 3,906,214 | 9/1975 | Hess | 364/829 |
|---|---|---|---|
| 4,023,019 | 5/1977 | Leibowitz et al. | 364/504 X |
| 4,031,380 | 6/1977 | Auctaire et al. | 364/829 X |
| 4,309,760 | 1/1982 | D'Antonio | 364/835 |
| 4,321,566 | 3/1982 | Berger et al. | 333/165 |
| 4,379,260 | 4/1983 | Labus | 364/605 X |
| 4,580,227 | 4/1986 | Lavergnat et al. | 364/807 X |

FOREIGN PATENT DOCUMENTS 0089203  9/1983  European Pat. Off. .

OTHER PUBLICATIONS

Barbe et al., "Signal Processing with Charge-Coupled Devices", *IEEE Journal of Solid-State Circuits*, vol. SC-13, No. 1, Feb. 1978.
"Proceedings of the 5th International Conference on Charge-Coupled Devices" Sep. 1979, pp. 33–39 (edite par J. Mavor, university of Edin . . .

*Primary Examiner*—Gary V. Harkcom
*Attorney, Agent, or Firm*—Roland Plottel

[57] ABSTRACT

An analog accumulator used in association with a solid state image analyzer for averaging and storing the fixed pattern noise (FPN) includes an N-stage transfer shift register with an input receiving a signal corresponding to the fixed pattern noise and with N outputs, N floating storage diodes each connected to an output of the transfer shift register, N reading parts each connected to a floating storage diode and each comprising a floating input diode connected to the floating storage diode through an injection gate, an injection device and a charge removal drain, and an N-stage transfer shift register with N inputs each connected to a reading part and with an output. The accumulator provides M integrations of N samples of an analog signal and delivers, at the end of the M integrations, the N accumulated samples several times.

3 Claims, 3 Drawing Sheets

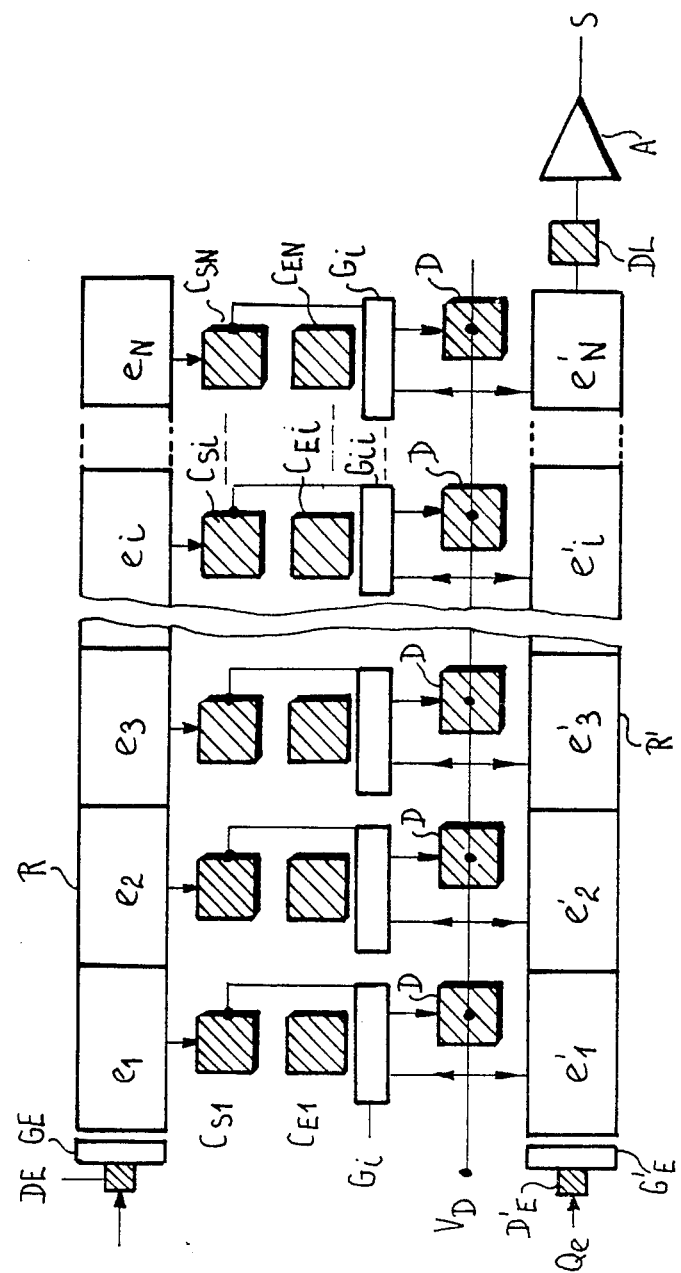
FIG_1

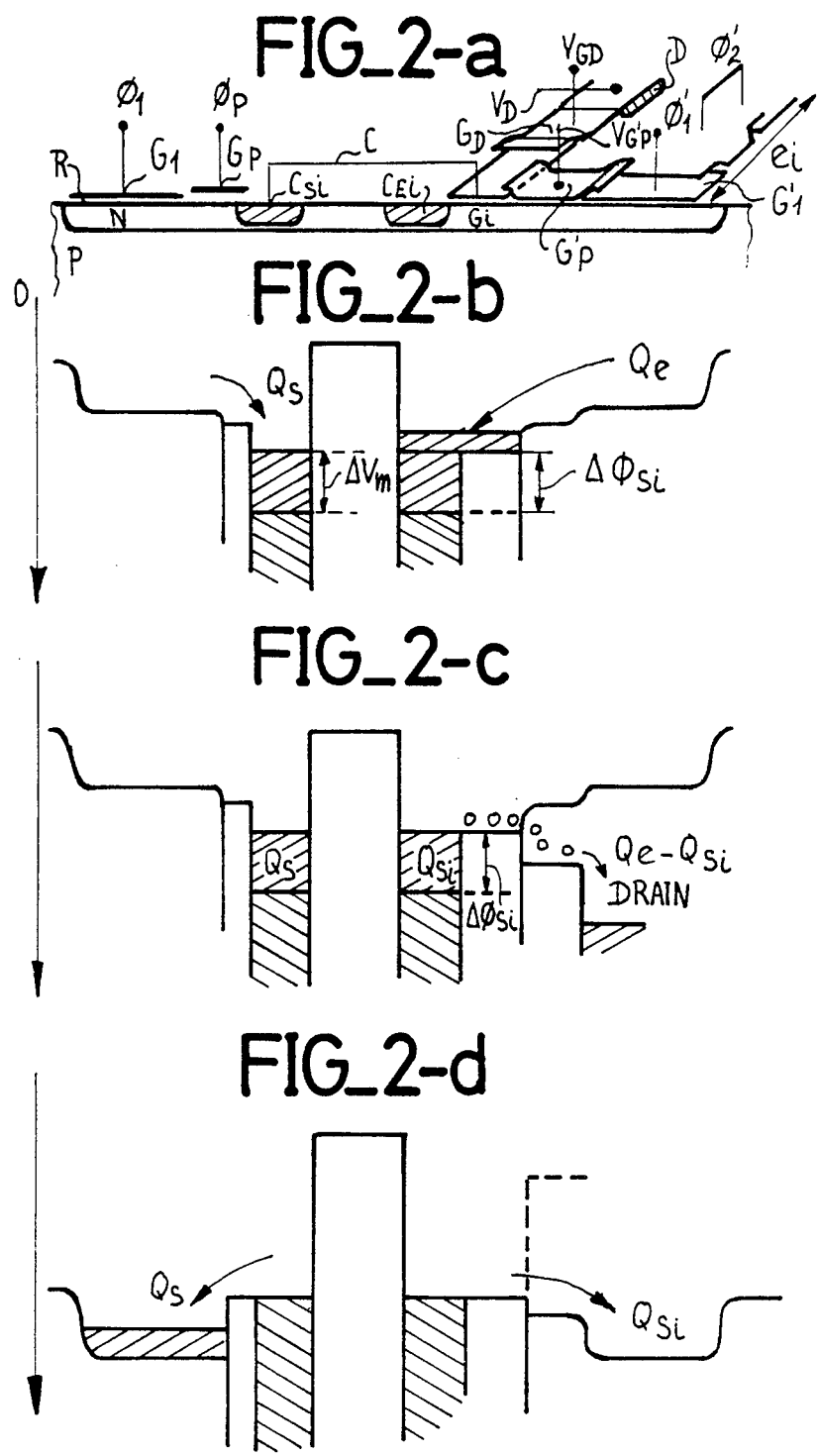

FIG_3-a
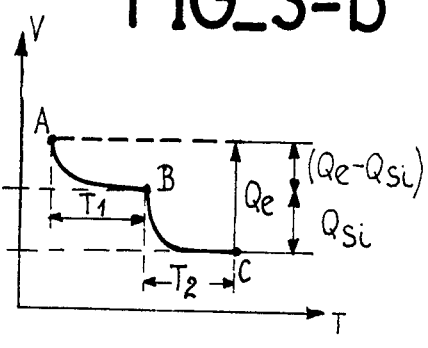
FIG_3-b
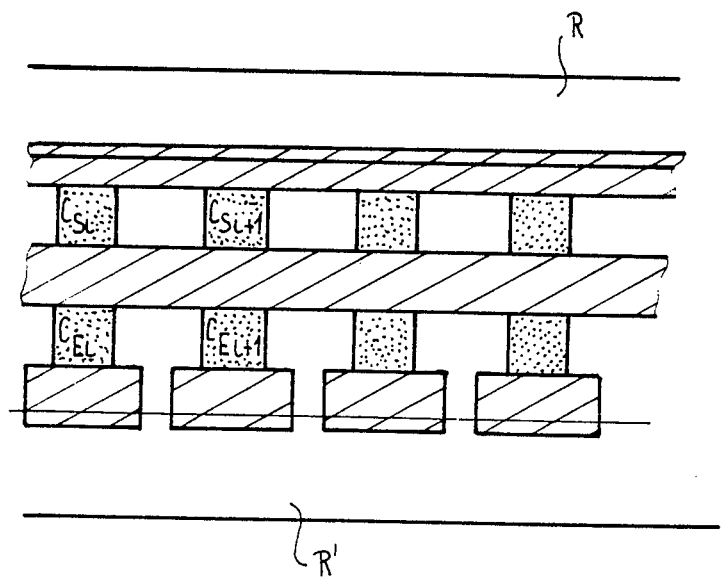
FIG_4

ANALOG ACCUMULATOR

BACKGROUND OF THE INVENTION

1. Field of the Invention

The present invention relates to an analog accumulator, more especially an analog accumulator used in association with a solid state image analyzer for averaging and storing the fixed pattern noise FPN.

In fact, in solid state image analyzers there frequently exists non uniformity of the dark signal which is reproduced in each line. This non uniformity or fixed noise is generally called FPN. To eliminate this non uniformity which causes a defect on the images to which the eye is very sensitive, it is stored and subtracted from each line of the video signal.

2. Description of the Prior Art

This operation is at present carried out using digital circuits in the following way:

the video signal of one or more black lines placed at the beginning of the frame, namely the parasite signal FPN, is digitalized using an analog-digital converter then stored in a random access memory. This memory is then read for each line, converted into analog form using a digital-analog converter and the parasite FPN signal is subtracted from the video signal so as to give a corrected video signal free of FPN.

The disadvantage of this technique is that it introduces a noise relative to time called "rain noise" which results from storing the time related noise during acquisition of the fixed noise called FPN.

Consequently, different improvements have been made to the basic circuits for reducing the amplitude of the "rain noise". One or these improvements is described, for example, in the European patent application published under n°89 203 in the name of Sony Corporation and consists in adding a level selector. However, these improvements increase the complexity so the manufacturing cost of the basic circuit which already comprises an analog-digital converter, a random access memory and a digital-analog converter.

Furthermore, when the parasite signal to be subtracted, mainly the FPN, is constant or slowly varying during the frames, the rain noise may be reduced by accumulating and averaging several fixed noise of FPN lines. In fact, accumulation of several FPN lines improves the FPN/rain noise ratio by a factor $\sqrt{M}$, if the accumulation takes place over M lines.

SUMMARY OF THE INVENTION

The present invention overcomes the disadvantages of digital circuits by providing an analog accumulator for accumulating N analog pieces of information and reading them non destructively.

The object of the present invention is therefore to provide an analog accumulator for integrating N analog pieces of information over M sequences, comprising a series-parallel demultiplexer with N stages for receiving and storing N pieces of information, N storage means connected to the N stages of the demultiplexer, each storage means effecting, for the M sequences, the summation and temporary storage of the analog informations of corresponding rank, N reading means connected to the N storage means for reading the analog informations contained in the storage means without destroying them and a parallel/series multiplexer with N stages, each stage of which is connected to one of the reading means so as to deliver, at the end of the M sequences, several times the N accumulated analog pieces of information.

In a preferred embodiment, particularly well adapted to the case where the accumulator is associated with a solid state image analyzer for obtaining a fixed FPN noise with reduced rain noise, the analog accumulator according to the invention comprises a charge transfer shift register with a series input and parallel outputs having N stages, N floating storage diodes each connected to a stage of the shift register through a passage gate, each diode providing, for the M sequences, accumulation and temporary storage of the analog informations of corresponding rank, N non destructive reading means each formed by a floating input diode for receiving a drive charge input by an injection means, an injection gate connected to the floating storage diode separating the floating input diode from a charge removal drain and the corresponding input stage of a charge transfer shift register with parallel inputs and a series output having N stages, so as to deliver in series, at the end of the M sequences, several times the N accumulated analog pieces of information.

BRIEF DESCRIPTION OF THE DRAWINGS

Other features and advantages of the present invention will be clear from reading the description of one embodiment made with reference to the accompanying drawings in which:

FIG. 1 is a top view of an analog accumulator in accordance with the present invention;

FIGS. 2a to 2d are respectively a view partially in perspective and in schematical section through II—II of FIG. 1 and diagrams showing the evolution of the surface potentials as a function of time;

FIGS. 3a and 3b are respectively a sectional view of the floating input diode and of the injection gate, a diagram showing the evolution of the surface potentials under these elements when the drive charge has been injected and a curve showing the evolution of the surface potential as a function of time on the floating diode; and FIG. 4 is a view for explaining the process used for forming floating storage and input diodes.

In the Figures, the same reference designate the same elements but for the sake of clarity the sizes and proportions of the different elements have not been respected.

DESCRIPTION OF THE PREFERRED EMBODIMENT

The present invention is described with reference to an analog accumulator associated with a solid stage image analyzer for obtaining a fixed noise called FPN with low rain noise. However, it is obvious for a man skilled in the art that the analog accumulator of the present invention may also be used whenever one or more pieces of averaged analog information are required which must be read several times.

A preferred embodiment of an analog accumulator in accordance with the present invention will now be described with reference to FIGS. 1 and 2a. This accumulator was constructed in the form of an integrated circuit using the CCD (charge coupled device) technology on a P type silicon substrate. Preferably, as shown in FIG. 2a, the accumulator is formed on an N zone formed in the P type silicon substrate so as to have volume transfer, which limits the transfer noise. However, it is obvious for a man skilled in the art that this accumulator may be formed on other substrates such as an N type silicon substrate, a gallium arsenide substrate or similar and that, in addition, the transfer may take place on the surface.

The accumulator of FIG. 1 comprises first of all a voltage-charge conversion stage shown symbolically by the diode $D_e$ and the gate $G_e$ which transforms the analog voltages corresponding to the FPN signal into charge amounts $Q_{n,m}$. This voltage-charge conversion stage is followed by a charge transfer shift register R of CCD type, with a series input and parallel outputs which, in the embodiment shown, has two phase operation. The charge transfer shift register R which receives N charge amounts corresponding to the N analog voltages of a sequence comprises N stages $e_1$ to $e_N$. Each stage of the register is formed in a way known per se by two electrode pairs each comprising a transfer electrode and a storage electrode. Each electrode pair is connected to an AC control potential $\phi_1$ and $\phi_2$ and in phase opposition. Furthermore, the storage electrode of the electrode pair controlled by $\phi_1$ is used as output and it is referenced $G_1$ in FIG. 2a. The electrode $G_1$ of each stage of the shift register R is separated from a charge storage means by a passage gate $G_p$ connected to a potential $\phi_P$, as shown in FIG. 2a.

The charge storage and accumulation means are formed by floating diodes $C_{S1} \ldots C_{Si} \ldots C_{Ni}$ formed in a way known per se by an $N^+$ type diffusion in the N zone of the substrate.

The analog accumulator of the present invention further comprises means for non destructive reading of the charges which have been accumulated in the diodes $C_{S1} \ldots C_{Si} \ldots C_{SN}$. These non destructive reading means are formed by an input floating diode $C_{E1}, C_{E2}, \ldots C_{Ei} \ldots C_{EN}$, a charge injection gate $G_i$ adjacent the corresponding input diode $C_{E1}$ to $C_{EN}$ and connected by a connection C to the corresponding storage diode $C_{S1}$ to $C_{SN}$. This charge injection gate $G_i$ separates the input diodes $C_{E1}$ to $C_{EN}$ from a charge removal drain formed by a passage gate $G_D$ connected to a potential $V_{GD}$ and a diode D polarized by the voltage $V_D$ and from stages $e'_1$ to $e'_N$ of a charge transfer shift register R' performing multiplexing of the accumulator charge amount. Furthermore, the non destructive reading means comprise a device for injecting a drive charge $Q_e$ whose role will be explained in detail further on. In the embodiment shown in FIG. 1, the device for injecting the drive charge $Q_e$ is formed by the charge transfer shift register R' which is provided with a series injection device shown schematically by the diode $D'_e$ and the passage gate $G'_e$. The use of register R' allows an identical drive charge $Q_e$ to be obtained at the level of each stage $e'_1$ to $e'_N$ corresponding to each non destructive reading means. Furthermore, the charge transfer shift register R' is used for delivering in series the N analog voltages corresponding to the N charge amounts accumulated in the storage means $C_{S1}$ to $C_{SN}$.

This charge transfer shift register R' is a two phase CCD type register with a structure identical to shift register R. It is controlled by control potentials $\phi'_1$ and $\phi'_2$ in phase opposition whose frequency may be different from the frequency of the control potentials $\phi_1$ and $\phi_2$ of register R as will be explained hereafter.

Furthermore, the storage electrode of the electrode pair controlled by $\phi'_1$ is used as input. It is referenced $G'_1$ in FIG. 2a and is separated from the reading means by a passage gate $G'_p$ connected to a potential $\phi'_p$.

The shift register R' is connected at the output to a charge-voltage conversion stage represented symbolically by the diode $D_L$ and amplifier A.

Operation of the analog accumulator of the present invention will now be described with reference more particularly to FIGS. 2b and 2d. This operation is described in a case where the analog accumulator is associated with a solid stage image analyzer for accumulating the FPN signal and obtaining at the output a parasite signal representative of the FPN signal with low rain noise.

Several lines containing the signal to be subtracted, namely the FPN signal, are first of all accumulated in the storage means $C_{S1}$ to $C_{SN}$. For carrying out this operation, whenever the video signal of a black line containing the signal to be subtracted appears, the video signal is connected to the series input of the shift register R, namely to diode $D_e$. The shift register R then loads all its stages $e_1$ to $e_N$ with a charge $Q_{nm}$ proportional to the FPN signal but containing the time related noise.

During the line suppression time, the potential $\phi_P$ applied to gate $G_P$ goes to a high level as shown in FIG. 2b and stages $e_1$ to $e_N$ of the CCD register R are emptied into the storage diodes $C_{S1}$ to $C_{SN}$.

By beginning this operation again, several black lines are accumulated in a storage means $C_{S1}$ to $C_{SN}$. In fact, the time for writing in the storage means $C_{S1}$ to $C_{SN}$ is chosen as a function of the desired noise reduction and within the dynamic range of the storage means at the temperature of use.

Furthermore, the sum of the charges arriving successively after M input sequences on the storage means $C_{S1}$ to $C_{SN}$ formed by floating diodes is accompanied by the variation of potential $\Delta V_N$ from a reference potential defined above, the value of this variation is given by the equation:

$$\Delta V_N = \frac{Q_S}{C_{Si}} \text{ with } Q_S = \Sigma_m Q_{n,m}.$$

Once the charges are accumulated, the N storage means $C_{S1}$ to $C_{SN}$ are read in a non destructive way by reading means and the charge transfer shift register R' with parallel inputs and a series output.

During each reading operation, a uniform drive charge $Q_e$ is injected into each stage of register R'.

Then, during line suppression, the following transfers are effected:

charge $Q_e$ is then transferred to the input diodes $C_{E1}$ to $C_{EN}$ as shown in FIG. 2b.

Charge $Q_e$ is chosen so as to be greater than the accumulated signal charge $Q_S$.

In addition, since the injection gates $G_i$ are floating gates connected by a connection C to the storage means $C_{Si}$, the potential variation $\Delta V_N$ is also applied to the injection gates $G_i$ and the result is a variation of the surface potential under each gate $G_i$ such that:

$$\Delta \phi_{Si} = \frac{C_{oxi}}{C_{oxi} + C_{depi}} \cdot \frac{Q_S}{C_{Si}}$$

with $C_{oxi}$ the oxide capacity under the corresponding gate and $C_{depi}$ the depletion capacity.

Thus, the charge $Q_e$, greater than $Q_S$, is distributed into diode $C_{Ei}$ and under gate $G_i$.

Then, as shown in FIG. 2c, the excess of charge $Q_e$ with respect to the potential barrier $\Delta\phi_{Si}$ is eliminated. For that, the potential of gate $G_d$ is lowered so that its surface potential is at a level higher than the surface potential under gate $G_i$ so that the excess charges are removed towards diode D.

There then remains on diode $C_{Ei}$ a charge $Q_{Si}$ such that:

$$Q_{si} = C_{Ei} \Delta\phi_{Si} = \frac{C_{oxi}}{C_{oxi} + C_{depi}} \cdot \frac{C_{Ei}}{C_{Si}} Q_S$$

Then, as shown in FIG. 2d, the charge $Q_S$ present on diode $C_{Si}$ is fed into the corresponding stage $e_i$ of the charge transfer shift register R by raising the potential $\phi_p$ of gate $G_p$ when $\phi_1$ is at a high level. This causes on gate $G_i$ a variation of potential in the reverse direction to the initial variation, that is to say that the potential barrier $\Delta\phi_{Si}$ disappears. Potential $\phi_P$ is brought to a high level and charge $Q_{Si}$ present in diode $C_{Ei}$ is transferred to the corresponding stage $e'_i$ of the shift register R'. The evolution of the potential on the floating diodes as a function of time has been shown in FIG. 3b and, by referring to FIG. 3a which corresponds to the right hand part of FIG. 2b, the evolution of the charges in the diode can be seen.

Since these operations are carried out during line suppression, on each stage $e'_1$ to $e'_N$ of the shift register R', charges $Q_{Si}$ are available proportional to the charges $Q_S$ which will be read and subtracted, after adjustment of the gain, for each video line coming from a solid stage image analyzer for the reading operation can be carried out during each line suppression, the accumulated charges $Q_S$ being stored in the shift register R and possibly fed back to the storage means for another reading operation. The advantage of the analog accumulator of the present invention and of the reading method used with this accumulator is that it allows an FPN signal to be obtained at the output with a limited time-related noise without adding additional noises at each conversion.

In fact, the time-related noise on the signal charge $Q_S$ is reduced by the successive summations. Furthermore, the time-related reading noise of the input diodes $C_{Ei}$ is low if care is taken to use reduced capacities.

Furthermore, so as to avoid introducing a multiplicative FPN which corresponds to the injection gain when a voltage-charge conversion is carried out in one stage, the dispersions on this injection gain should be reduced as much as possible.

$$\text{Now } G_i = \frac{C_{oxi}}{C_{oxi} + C_{dipi}} \cdot \frac{C_{Si}}{C_{Ei}}$$

Consequently, in order to reduce the dispersions over the injection gain, a weakly doped substrate should be used (for example a silicon P substrate doped to $5.10^{14}$ atoms/cm$^3$ with an N zone formed by implantation of phosphorous at a dose of $10^{12}$ atoms/cm$^3$) with a small oxide thickness (for example 500 to 1000 Å) so that:

$$C_{depi} << C_{oxi}$$

and $$\frac{C_{oxi}}{C_{oxi} + C_{Depi}} \#1$$

Thus the dispersion on this component of the gain will be very small.

Furthermore, it is important to define diodes $C_{Si}$ and $C_{Ei}$ by the same masking level and strictly symmetrically as shown in FIG. 4 so as to have $$C_{Si} = \alpha C_{Ei}$$

Consequently, if diodes $C_{Si}$ and $C_{Ei}$ vary from one stage to the other, their relationship remains constant and so $Q_{Si} = \alpha Q_S$ is obtained.

Moreover, the advantage of the above described non destructive parallel injection method is to determine, stage by stage, the charge injected by the difference between two surface potentials under the same gate. The injected charge does not depend on the absolute value of these potentials. It is therefore insensitive to the MOS threshold variations due to the spatial inhomogeneities of the material or the manufacturing process.

What is claimed is:

1. An analog accumulator for realizing M integrations of N analog samples of information in the form of N quantities of charges with $N \geq 2$ and $M \geq 1$ comprising:
    an N-stage input charge transfer shift register with a serial input for connection to a voltage-charge conversion means and N parallel outputs for receiving the packets of charges,
    N storage floating diodes, each connected to a respective output of the N-stage input charge transfer shift register, each storage floating diode providing the M integrations and temporary storing of the summation of the quantity of charges contained in the corresponding stage of the N-stage input charge transfer shift register,
    N reading floating diodes, each adjacent to an injection gate connected to the corresponding storage floating diode,
    means for injecting into the reading floating diodes a drive charge,
    a charge removal drain adjacent said injection gate, and
    an N-stage output charge transfer shift register with N parallel inputs and a serial output, each input connected to a respective one of the reading floating diodes through a switching means which is closed periodically a number of times after each set of M integrations, said N-stage output charge transfer shift register delivering at the end of the M integrations, the accumulated samples of information in the form of an analog signal.

2. The accumulator of claim 1 in which the drive charge injecting means comprises means for injecting a uniform charge into all stages of the output charge transfer shift register.

3. The accumulator of claim 1 which is formed in an N-type surface portion of a semiconductor crystal whose bulk is P-type.

* * * * *